US012690183B2

(12) United States Patent
Desai et al.

(10) Patent No.: US 12,690,183 B2
(45) Date of Patent: Jul. 21, 2026

(54) MEMORY WITH BITCELL-TO-PERIPHERY INTERFACE TAP CELL

(71) Applicant: QUALCOMM Incorporated, San Diego, CA (US)

(72) Inventors: Channappa Desai, Haveri (IN); Sunil Sharma, Bangalore (IN); Anne Srikanth, Bangalore (IN); Sherin Bose, Bangalore (IN); Pradeep Jayadev Kodlipet, Bangalore (IN); Biju Manakkam Veetil, Bengaluru (IN); Rahul Biradar, Kalaburgi (IN); Sung Son, San Jose, CA (US); Manjeet Singh Lowanshi, Bangalore (IN); Kamlesh Kumar, Bangalore (IN)

(73) Assignee: QUALCOMM INCORPORATED, San Diego, CA (US)

( * ) Notice: Subject to any disclaimer, the term of this patent is extended or adjusted under 35 U.S.C. 154(b) by 97 days.

(21) Appl. No.: 18/680,474

(22) Filed: May 31, 2024

(65) Prior Publication Data

US 2025/0374511 A1     Dec. 4, 2025

(51) Int. Cl.
*G11C 5/14*        (2006.01)
*H10B 10/00*      (2023.01)

(52) U.S. Cl.
CPC ............. *H10B 10/18* (2023.02); *G11C 5/146* (2013.01)

(58) Field of Classification Search
CPC ................................ H10B 10/18; G11C 5/146
USPC .............................................. 365/226, 230.06
See application file for complete search history.

(56)                 References Cited

U.S. PATENT DOCUMENTS

| | | | | |
|---|---|---|---|---|
| 8,320,165 B1 * | 11/2012 | Garcia | ................... | H10B 10/18 |
| | | | | 257/E21.63 |
| 2016/0336343 A1 * | 11/2016 | Kuo | ..................... | H10D 84/907 |
| 2020/0335142 A1 * | 10/2020 | Schreiber | ................ | G11C 7/06 |
| 2021/0142849 A1 * | 5/2021 | Yabuuchi | ................. | G11C 8/14 |
| 2021/0175171 A1 * | 6/2021 | Jung | ................... | H01L 23/5286 |
| 2023/0333742 A1 | 10/2023 | English et al. | | |
| 2023/0354573 A1 | 11/2023 | Yang et al. | | |

OTHER PUBLICATIONS

International Search Report and Written Opinion—PCT/US2025/026246—ISA/EPO—Jul. 18, 2025.

* cited by examiner

*Primary Examiner* — Michael T Tran
(74) *Attorney, Agent, or Firm* — Loza & Loza, LLP

(57)                 ABSTRACT

A memory includes a periphery separated from one or more banks by a bitcell-to-periphery interface. The periphery includes logic circuits for the reading and writing to bitcells within the neighboring banks. Tap cells for the biasing of the periphery extend across the bitcell-to-periphery interface.

17 Claims, 6 Drawing Sheets

Poly lines

-- Prior Art-- biasing a first n-well portion of the periphery from a first n-doped tap cell in a first interface between the periphery and a first bank of bitcells — 500 biasing a first p-doped substrate portion of the periphery from a first p-doped tap cell in the first interface — 505

600

605

610

MEMORY WITH BITCELL-TO-PERIPHERY INTERFACE TAP CELL

TECHNICAL FIELD

The present application relates memories, and more specifically to a memories in which tap cells in the bitcell-to-periphery interface bias the body of transistors in the memory periphery.

BACKGROUND

A metal-oxide semiconductor field-effect transistor (MOSFET) includes a source terminal, a drain terminal, and a gate terminal. A channel is inverted so that the MOSFET may conduct depending upon the voltage applied to the gate terminal. In an n-type MOSFET (also denoted as an n-type metal-oxide semiconductor (NMOS) transistor), electrons flow in the channel from the source terminal to the drain. Conversely, holes flow in the channel from the drain terminal to the source terminal in a p-type MOSFET (also denoted as a p-type metal-oxide semiconductor (PMOS) transistor). Although the transistor channel and current flow depends on these three terminals, a MOSFET may be subject to latch-up if the p-n junction between p-doped and n-doped regions in the MOSFET become forward biased.

To prevent latch-up, a MOSFET traditionally has a fourth terminal to its body. The body has the same doping as the channel and is ohmically coupled to the channel. The body is thus doped n-type in a PMOS transistor whereas it is doped p-type in PMOS transistor. To prevent latch-up in a PMOS transistor, the body terminal is charged to a power supply voltage (or higher) whereas the body terminal is grounded (or biased to a negative voltage) in an NMOS transistor. Although the use of a body terminal thus prevents latch-up, the body terminal occupies space on the semiconductor die in which the transistor is integrated and thus lowers density (lowers the number of devices per unit area of semiconductor die space). To increase density, tap cells have been developed The biasing from the tap cell may be applied to the substrate or to well regions in the substrate. For example, suppose that the substrate is doped p-type. The substrate may thus form the body of NMOS transistors. A group of neighboring NMOS transistors may have their body biased by a p-doped tap cell (or cells) that ohmically couples to the substrate sufficiently near the group of transistors. Assuming the substrate is doped p-type, a neighboring group of PMOS transistors may then be formed in an n-doped well (n-well) within the substrate. An n-doped tap cell (or cells) ohmically couples to the n-well to bias the body of the NMOS transistors. The resulting use of tap cells increases density (the number of transistors that may be integrated into a given area of semiconductor die space) as compared to the use of individual body terminals.

SUMMARY

In accordance with an aspect of the disclosure, a memory integrated onto a substrate doped according to a first conductivity type is provided that includes: a first bank of bitcells; a periphery for the first bank of bitcells; a first bitcell-to-periphery interface having a first boundary shared with the first bank of bitcells and having a second boundary shared with the periphery, wherein the substrate includes a first well doped according to a second conductivity type that extends across the periphery; and a first tap cell doped according to the second conductivity type for biasing the first well, the first tap cell being located in a portion of the first well within the first bitcell-to-periphery interface.

In accordance with another aspect of the disclosure, a method of biasing a periphery of a memory is provided that includes the acts of: biasing a first n-well portion of the periphery from a first n-doped tap cell in a first interface between the periphery and a first bank of bitcells; and biasing a first p-doped substrate portion of the periphery from a first p-doped tap cell in the first interface.

Finally, in accordance with yet another aspect of the disclosure, a memory is provided that includes: a first bank of bitcells; a second bank of bitcells; a periphery for the first bank of bitcells and for the second bank of bitcells; a first interface between the first bank of bitcells and the periphery; a second interface between the second bank of bitcells and the periphery; and a plurality of n-doped tap cells for biasing n-well portion of the periphery, the plurality of n-doped tap cells being located within at least one of the first interface and the second interface.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

Tap cells increase density as compared to the use of individual body terminals for each MOSFET. A MOSFET in a modern integrated circuit will thus typically have its body biased by at least one tap cell. One application of tap cells is to bias the memory periphery for a memory such as a static random-access memory (SRAM). As compared to the bitcell array, the memory periphery (also denoted herein as a periphery for brevity) contains logic circuits such as address decoders and related circuits that assist in the reading and writing to the bitcell array. To prevent latch-up, the transistors within the periphery need their body properly biased. It is thus conventional to bias the periphery with a column of tap cells.

Figure 1:
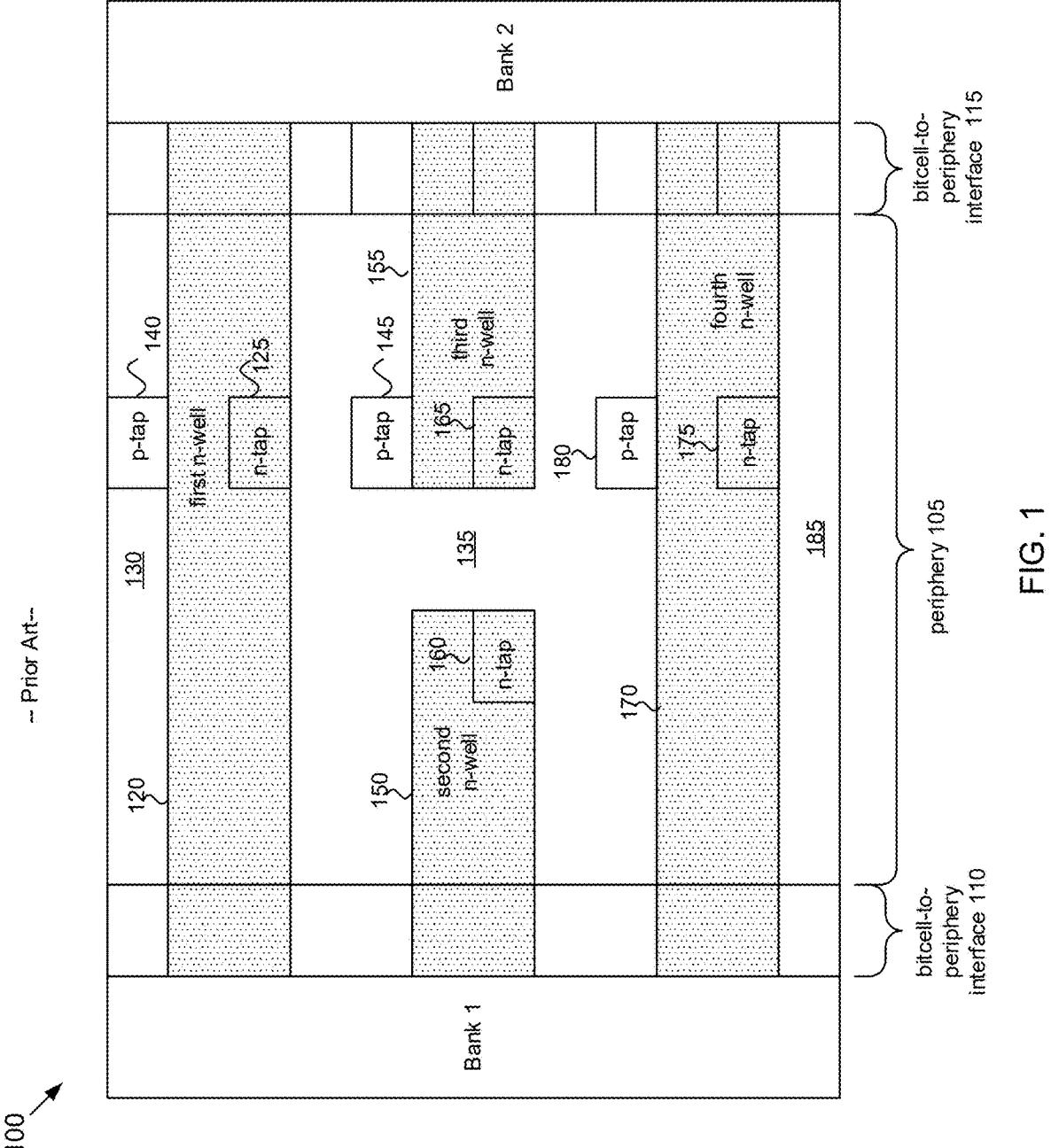
FIG. 1 illustrates a traditional tap cell layout for the biasing of a memory periphery.

An example memory 100 including a tap call layout for the biasing of periphery 105 is shown in FIG. 1. The periphery 105 is located on the semiconductor die for the memory 100 between a first bank of bitcells (Bank 1) and a second bank of bitcells (Bank 2). As used herein, a bank of bitcells refers to a bitcell array having its own columns and rows of bitcells. Should the bitcells instead be organized into a single array, the capacitance of the resulting word lines and bit lines may be too large. The banks are not drawn to scale in FIG. 1 for illustration clarity. The periphery 105 assists in the reading and writing to both the first bank and the second bank. Each bank has a regular arrangement of transistors that does not apply to the periphery 105. There is thus a bitcell-to-periphery interface 110 between the first bank and the periphery 105. Similarly, there is a bitcell-to-periphery interface 110 between the second bank and the periphery 105.

In memory 100, the substrate in which the memory is formed is doped p-type. NMOS transistors in the periphery 105 may thus be formed in this p-doped substrate. But PMOS transistors in the periphery are formed in corresponding n-doped n-wells within the p-doped substrate. For example, a first n-well 120 extends from the bitcell-to-periphery interface 110 to the bitcell-to-periphery interface 115. A n-doped tap cell 125 biases the first n-well 120. The first n-well 120 extends between a region 130 and a region 135 of the p-doped substrate. A p-doped tap cell 140 biases the region 130 whereas a p-doped tap cell 145 biases an upper portion of the region 135.

Since the periphery 105 interfaces between a memory power domain for the banks and a core power domain for a digital core (e.g., a processor), the n-wells in the periphery 105 may be divided into two separate power domains. For example, a single n-well does not extend below the first n-well 125 but instead is divided into a second n-well 150 and a third n-well 155. The second n-well extends to the bitcell-to-periphery interface 110 and is separated from the third n-well 155 by an n-well-to-n-well gap. The third n-well 155 extends from the n-well-to-nell-well gap to the bitcell-to-periphery interface 115. An n-doped tap cell 160 biases the second n-well 150. Similarly, an n-doped tap cell 165 biases the third n-well 155. Since the p-doped region 135 lies both above and below (as well as in between) the second n-well 150 and the third n-well 155, another p-doped tap cell 180 biases the lower portion of the region 135 that lies below the second n-well 150 and the third n-well 155. A fourth n-well 170 separates the region 135 from another region 185 of the p-doped substrate. An n-doped tap cell 175 biases the fourth n-well 170.

A height of the n-wells is twice a height of the standard cells used to form the transistors. The height of the n-wells is twice a height of the substrate regions 130 and 185. Polysilicon lines (not illustrated) for the transistor gates and dummy gates in the periphery 105 extend in the vertical direction. These polysilicon lines are arranged according to a pitch (separation between the adjacent ones of the lines). The width of each of the interfaces 110 and 115 is defined by a certain multiple of this pitch that depends upon semiconductor foundry rules and the process node. In one implementation, a width of each of the interfaces 110 and 115 equals eight times the polysilicon line pitch. Similarly, a width for each of the tap cells is also defined by a multiple of the polysilicon line pitch. In one implementation, this tap cell width is twelve times the polysilicon line pitch. From the second n-well 150 to the third n-well 155, the tap cells 160 and 165 thus occupy twenty-four times the polysilicon line pitch. A width dimension occupied by the interfaces 110 and 115 as well as the tap cells 160 and 165 is thus 24+8+8=40 times the polysilicon line pitch (CPP).

The resulting consumption of semiconductor die space by the interfaces and the tap cells lowers the density. In addition, the column of tap cells formed by the tap cells 140, 125, 145, 180, and 175 introduces a transition of n+ doping to p+ doping for the tap cells that requires double diffusion breaks to meet foundry design constraints. The double diffusion breaks undesirably increase the threshold voltage for neighboring transistors.

Figure 2:
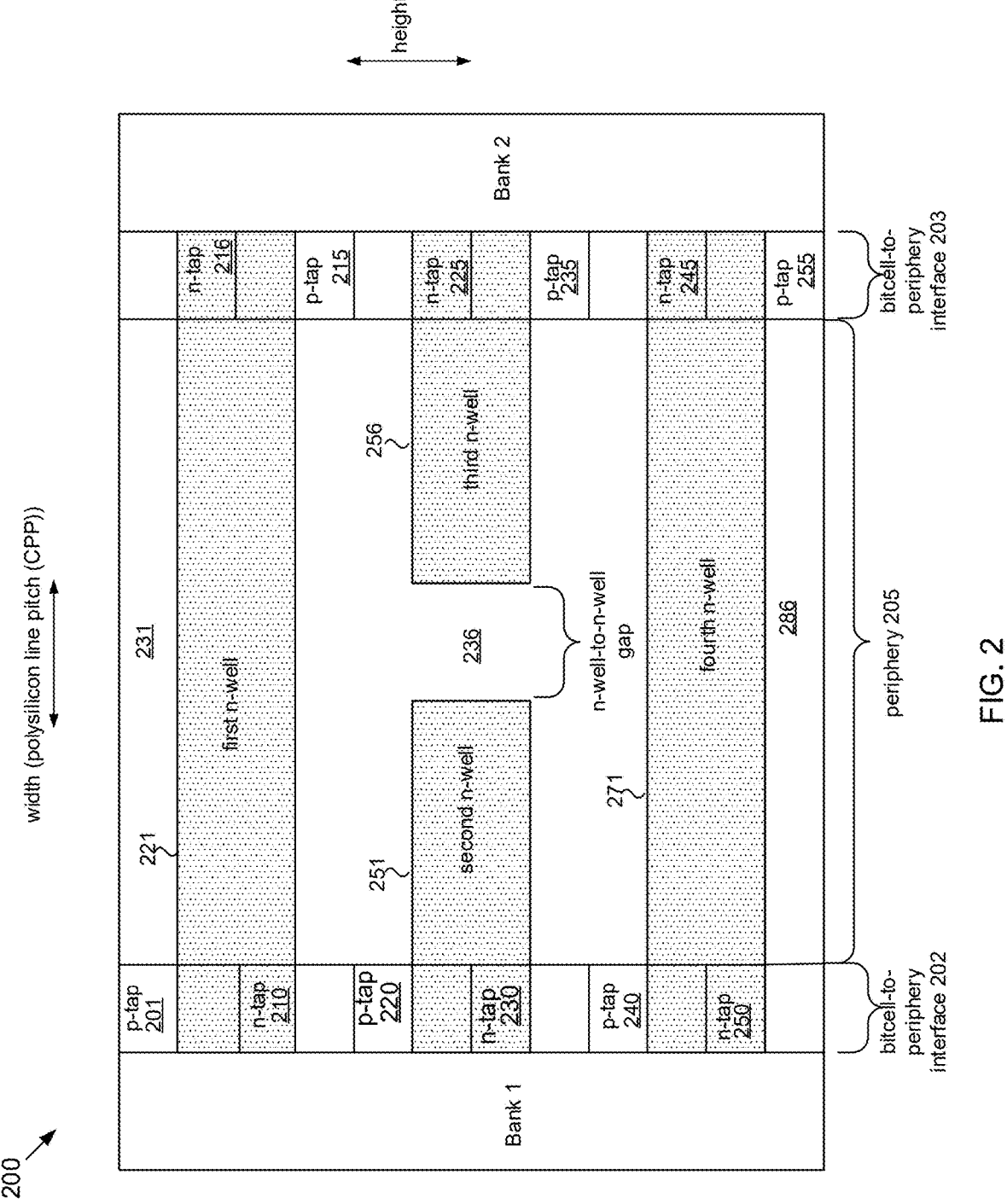
FIG. 2 illustrates a first tap cell layout for the biasing of a memory periphery in accordance with an aspect of the disclosure.

A tap cell layout for a memory periphery is disclosed that addresses these drawbacks. An example memory 200 is shown in FIG. 2. As discussed for memory 100, a periphery 205 in memory 200 is located on the semiconductor die for the memory 200 between a first bank of bitcells (Bank 1) and a second bank of bitcells (Bank 2). The periphery 205 assists in the reading and writing to both the first bank and the second bank. Each bank has a regular arrangement of transistors that does not apply to the periphery 205. Thus, a bitcell-to-periphery interface 202 intervenes between the first bank and the periphery 205. Similarly, a bitcell-to-periphery interface 203 intervenes between the second bank and the periphery 205.

In memory 200, the substrate in which the memory is formed is doped p-type. However, it will be appreciated that an n-doped substrate may be used in alternative implementations. The substrate may thus be deemed to be doped according to a first conductivity type whereas a plurality of wells within the substrate are doped according to a second conductivity type. As used herein, the term "substrate" refers to the semiconductor region forming the body of the transistors in the periphery 205. Such a semiconductor region may be deposited over yet another semiconductor substrate. Since the substrate is doped p-type, NMOS transistors in the periphery 205 may be formed in this p-doped substrate. But PMOS transistors in the periphery 205 are formed in corresponding n-doped n-wells within the p-doped substrate. The n-wells divide the p-doped substrate into regions that border the n-wells. In memory 200, the periphery 205 is divided into n-wells arranged analogously as discussed for periphery 105. However, it will be appreciated that other n-well configurations may be used in alternative implementations.

In periphery 205, a first n-well 221 extends from the bitcell-to-periphery interface 202 to the bitcell-to-periphery interface 203. The first n-well 221 is bordered above by a region 231 and below by a region 236 of the p-doped substrate. A second n-well 251 extends across the periphery 205 from the bitcell-to-periphery interface 202 to an n-well-to-n-well gap. A third n-well 256 extends across the periphery 205 from the n-well-to-n-well gap to the bitcell-to-periphery interface 203. The p-doped region 236 lies both above and below the second n-well 251 and the third n-well 256 (and also in the n-well-to-n-well gap between the second n-well 251 and the third n-well 256). A fourth n-well 271 in the periphery 205 separates the region 236 from a region 286 of the p-doped substrate. The fourth n-well 271 extends across the periphery 205 from the bitcell-to-periphery interface 202 to the bitcell-to-periphery interface 203. As also discussed analogously for periphery 105, the height of the n-wells in periphery 205 is twice a height of the p-doped regions 231 and 286. Across the n-well-to-n-well gap, the p-doped region 236 has a height that is three times the height of each n-well. Each n-well and p-doped region should be biased to prevent latch-up. To increase density, the tap cells for the biasing of the periphery 205 are located either entirely or partially in the bitcell-to-periphery interfaces 202 and 203.

A width of the interfaces 202 and 203 as well as the width of the periphery 205 may be defined with respect to the polysilicon line pitch (CPP) for the polysilicon gates for the transistors and for dummy gates. As will be explained further herein, the width of the tap cells is nine CPP such that each of the interfaces 202 and 203 has a width of nine CPP.

Each tap cell for the biasing of the periphery 205 has the single standard cell height of the p-doped regions 231 and 286. In periphery 205, the p-doped region 231 is biased by a p-doped tap cell (p-tap) 201 extending across the width of the bitcell-to-periphery interface 202. Similarly, the p-doped region 286 is biased by a p-doped tap cell 255 extending across the width of the bitcell-to-periphery interface 203. Since the n-wells have twice the height of the p-doped region 231, a pair of n-doped tap cells biases each n-well. For example, the first n-well 221 is biased by an n-doped tap cell (n-tap) 210 that extends across the width of the bitcell-to-periphery interface 202. The n-doped tap cell 210 is separated from a lower boundary of the p-doped tap cell 201 by one standard cell height. A lower boundary of the n-doped tap cell 210 is thus aligned with a lower boundary of the first n-well 221. The first n-well 221 is also biased by a n-doped tap cell 216 that extends across the width of the bitcell-to-periphery interface 203. An upper boundary of the n-doped tap cell 216 is aligned with an upper boundary of the first n-well 221.

An upper portion of the p-doped region 236 also has a height that is twice the standard cell height, so it is biased by a pair of p-doped tap cells including a p-doped tap cell 220 extending across the width of the bitcell-to-periphery interface 202 and a p-doped tap cell 215 extending across the width of the bitcell-to-periphery interface 203. A lower boundary of the p-doped tap cell 220 is aligned with an upper boundary of the second n-well 251 such that the p-doped tap cell 220 is spaced apart from the n-doped tap cell 210 by one standard cell height. Similarly, an upper boundary of the p-doped tap cell 215 is aligned with a lower boundary of the first n-well 221 such that the p-doped tap cell 215 is spaced apart from the n-doped tap cell 216 by one standard cell height. As will be discussed further herein, each of the remaining tap cells for the periphery 205 maintain this one-standard-cell-height spacing from adjacent ones of the tap cells.

The second n-well 251 extends across less than half the width of the periphery 205 and can thus be biased by a single n-doped tap cell 230 that extends across the bitcell-to-interface periphery 202. A lower boundary of the n-doped tap cell 230 aligns with a lower boundary of the second n-well 251. The n-doped tap cell 230 is thus spaced apart from the p-doped tap cell 220 by a single standard cell height. The third n-well 256 is similarly biased by a single n-doped tap cell 225. An upper boundary of the n-doped tap cell 225 aligns with an upper boundary of the third n-well 256. The n-doped tap cell 225 is thus spaced apart from the p-doped tap cell 215 by one standard cell height.

A lower portion of the p-doped region 236 also has a height that is twice the standard cell height, so it is biased by a pair of p-doped tap cells including a p-doped tap cell 240 extending across the width of the bitcell-to-periphery interface 202 and a p-doped tap cell 235 extending across the width of the bitcell-to-periphery interface 203. A lower boundary of the p-doped tap cell 240 is aligned with an upper boundary of the fourth n-well 271 such that the p-doped tap cell 240 is spaced apart from the n-doped tap cell 230 by one standard cell height. Similarly, an upper boundary of the p-doped tap cell 235 is aligned with a lower boundary of the third n-well 256 such that the p-doped tap cell 235 is spaced apart from the n-doped tap cell 225 by one standard cell height.

An n-doped tap cell 250 and an n-doped tap cell 245 bias the fourth n-well 271. The n-doped tap cell 250 extends across the width of the bitcell-to-periphery interface 202. The n-doped tap cell 250 is separated from an upper boundary of the fourth n-well 271 by one standard cell height. A lower boundary of the n-doped tap cell 250 is thus aligned with a lower boundary of the fourth n-well 271 such that the n-doped tap cell 250 is spaced apart from the p-doped tap cell 240 by one standard cell height. The n-doped tap cell 245 extends across the width of the bitcell-to-periphery interface 203. An upper boundary of the n-doped tap cell 245 is aligned with an upper boundary of the fourth n-well 271 such that the n-doped tap cell 245 is spaced apart from the p-doped tap cell 235 by one standard cell height.

Finally, the p-doped region 286 has only a single standard cell height so it is biased by a p-doped single tap cell 255 that extends across the bitcell-to-periphery interface 203. Since the upper boundary of the n-doped tap cell 245 is aligned with the upper boundary of the fourth n-well 271, the p-doped tap cell 255 is spaced apart from the n-doped tap cell 245 by one standard cell height.

Figure 3A:
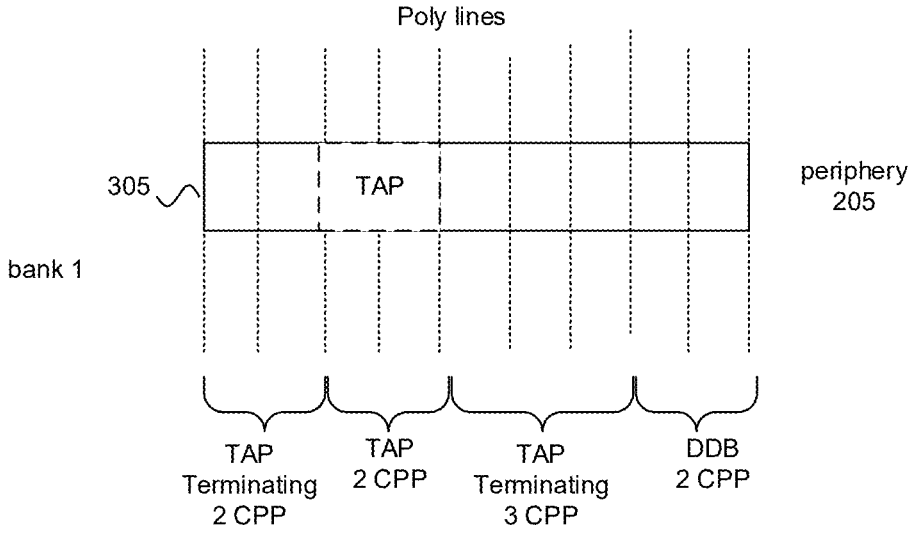
FIG. 3A illustrates a generic tap cell in a first bitcell-to-periphery interface in accordance with an aspect of the disclosure.

The tap cells 201, 210, 220, 230, 240, and 250 that extend across the width of the bitcell-to-periphery interface 202 may be implemented as shown for a generic tap cell 305 of FIG. 3A. The tap cell 305 begins at the boundary of the first bank with a tap terminating region that extends across 2 CPP (two polysilicon (poly)) lines to a tap region that also extends across 2 CPP. The tap region is either doped n+ or p+ depending upon whether tap cell 305 is for an n-well or a p-well, respectively. Following the tap region is a tap terminating region that extends across 3 CPP to a double diffusion break (DDB). The double diffusion break extends across 2 CPP. The tap cell 305 thus has a width of nine CPP.

Figure 3B:
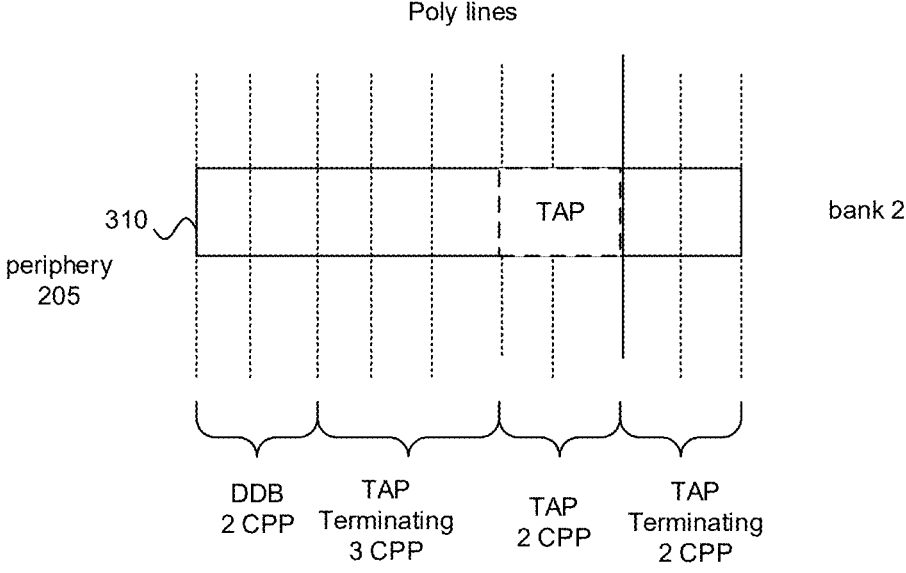
FIG. 3B illustrates a generic tap cell in a second bitcell-to-periphery interface in accordance with an aspect of the disclosure.

The tap cells 216, 215, 225, 235, 245, and 255 that extend across the width of the bitcell-to-periphery interface 203 may be implemented as shown for a generic tap cell 310 of FIG. 3B. The tap cell 310 begins at the boundary of the second bank with a tap terminating region that extends across 2 CPP to a tap region that also extends across 2 CPP. The tap region is either doped n+ or p+ depending upon whether tap cell 310 is for an n-well or a p-well, respectively. Following the tap region is a tap terminating region that extends across 3 CPP to a double diffusion break (DDB). The double diffusion break extends across 2 CPP. The tap cell 310 thus has a width of nine CPP>

Note the advantages of the resulting tap cell biasing of the periphery 205. The tap cells 310 and 305 each have a width of just nine CPP such that their combined width is eighteen CPP. This combined width is substantially smaller than the combined width of forty CPP for the tap cell biasing and interfaces for periphery 105. Memory 200 is thus advantageously dense (a higher number of transistors per unit area of semiconductor die space) as compared to memory 100. In addition, the effect of the double diffusion breaks for periphery 205 is reduced as compared to that for periphery 105.

Figure 4:
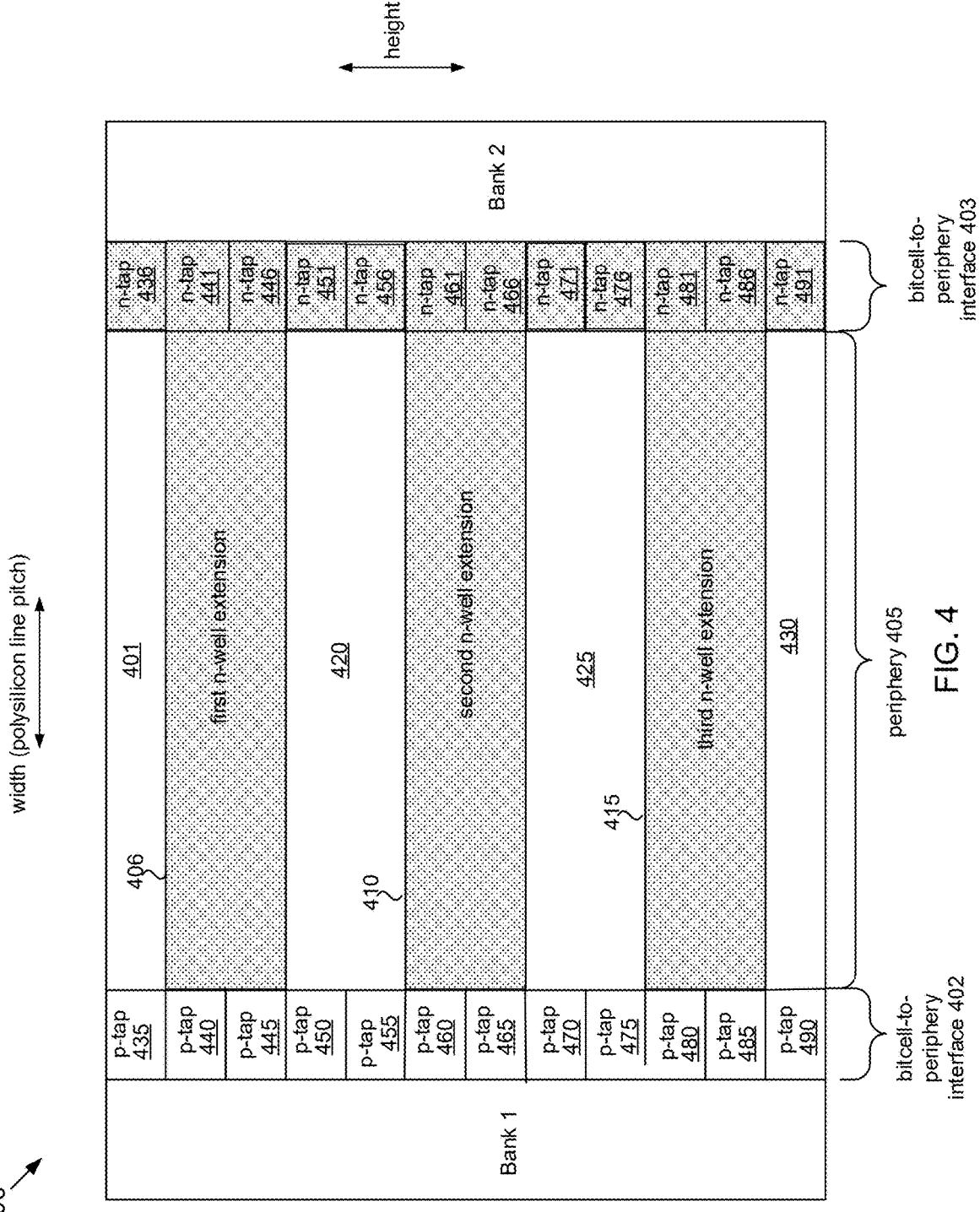
FIG. 4 illustrates a second tap cell layout for the biasing of a memory periphery in accordance with an aspect of the disclosure.

In an alternative implementation in which the substrate is doped p-type, a first one of the bitcell-to-periphery interfaces may be entirely absent of an n-well whereas a remaining second one of the interfaces may be entirely occupied by an n-well. The first interface is thus dedicated to p-doped tap cells whereas the second interface is dedicated to n-doped tap cells. An example memory 400 is shown in FIG. 4. As discussed for memory 200, a periphery 405 in memory 400 is located on the semiconductor die for the memory 400 between the first bank of bitcells (Bank 1) and the second bank of bitcells (Bank 2). The periphery 405 assists in the reading and writing to both the first bank and the second bank. Each bank has a regular arrangement of transistors that does not apply to the periphery 405. Thus, a bitcell-to-periphery interface 402 intervenes between the first bank and the periphery 405. Similarly, a bitcell-to-periphery interface 403 intervenes between the second bank and the periphery 405. The bitcell-to-periphery interface 402 is entirely occupied by a p-well whereas the bitcell-to-periphery interface 403 is entirely occupied by an n-well.

In memory 400, the substrate in which the memory is formed is doped p-type. However, it will be appreciated that the substrate may be doped n-type in alternative implementations. Since the substrate is doped p-type, NMOS transistors in the periphery 405 may be formed in this p-doped substrate. But PMOS transistors in the periphery 405 are formed in corresponding n-doped n-well extensions within the p-doped substrate. These n-well portions are denoted as "extensions" because they are contiguous with the n-well occupying the bitcell-to-periphery interface 403. The n-well extensions in the periphery 405 divide the p-doped substrate into regions that border the n-wells. In periphery 405, a first n-well extension 406 extends from the border of the periphery 405 with the bitcell-to-periphery interface 402 and across to the bitcell-to-periphery interface 403. The first n-well extension 406 is bordered above by a region 401 and below by a region 420 of the p-doped substrate. A second n-well extension 410 extends across the periphery 405 from the border of the periphery 405 with the bitcell-to-periphery interface 402 and across to the bitcell-to-periphery 403. A third n-well extension 415 also extends across the periphery 405 from the extends from the border of the periphery 405 with the bitcell-to-periphery interface 402 and across to the bitcell-to-periphery interface 403. A p-doped region 425 separates the second n-well extension 410 from the third n-well extension 415. Finally, a p-doped region 430 is positioned below the third n-well extension 415. P-doped regions 401 and 430 each have a height of one standard cell whereas the remaining regions 420 and 425 as well as the n-well extensions 406, 410, and 415 all have a height of two standard cells. However, it will be appreciated that alternative arrangements of n-wells may be used in memory 400.

Since the bitcell-to-periphery interface 402 is all occupied by the p-doped substrate, it is the bitcell-to-periphery interface 402 that contains all the p-doped tap cells. Similarly, since the bitcell-to-periphery interface 403 is occupied by the n-well, it is the bitcell-to-periphery interface 403 that that contains all the n-doped tap cells. A single p-doped tap cell 435 that extends across the width of the interface 402 and has a height of just one standard cell. Below the p-doped tap cell 435 in order is a p-doped tap cell 440, a p-doped tap cell 450, a p-doped tap cell 455, a p-doped tap cell 460, a p-doped tap cell 465, a p-doped tap cell 475, a p-doped tap cell 480, a p-doped tap cell 485, and a p-doped tap cell 490. Like the p-doped tap cell 435, these remaining p-doped tap cells each extends across the bitcell-to-periphery interface 402 and has a height of one standard cell.

The n-well extensions 406, 410, and 415 are all biased by n-doped tap cells in the bitcell-to-periphery interface 403. In order from the top to the bottom of the bitcell-to-periphery interface 403, there is an n-doped tap cell 436, an n-doped tap cell 441, an n-doped tap cell 451, an n-doped tap cell 461, an n-doped tap cell 466, an n-doped tap cell 471, an n-doped tap cell 476, an n-doped tap cell 481, an n-doped tap cell 486, and an n-doped tap cell 491. Each of these n-doped tap cells extends across the bitcell-to-periphery interface 403 and has a height of one standard cell.

Figure 5:
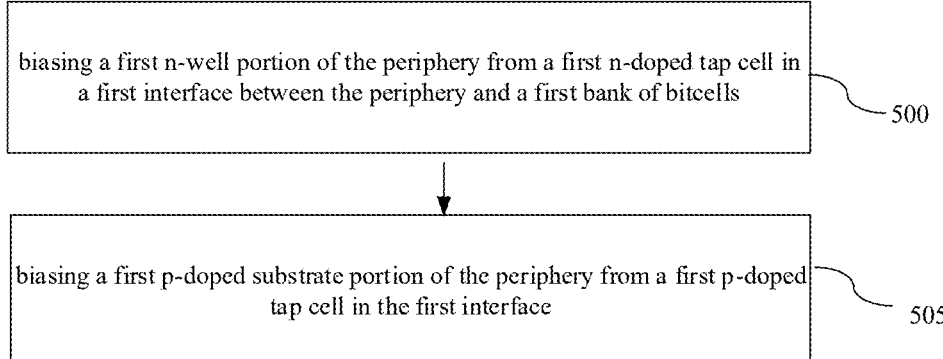
FIG. 5 is a flowchart of a method of biasing a memory periphery in accordance with an aspect of the disclosure.

A method of biasing a periphery will now be discussed with respect to the flowchart of FIG. 5. The method includes an act 500 of biasing a first n-well portion of the periphery from a first n-doped tap cell in a first interface between the periphery and a first bank of bitcells. An example of act 500 is the biasing of the corresponding n-well from any of n-doped tap cells 210, 230, and 250 of memory 200. The method further includes an act 510 of biasing a first p-doped substrate portion of the periphery from a first p-doped tap cell in the first interface. An example of act 505 is the biasing of the corresponding p-doped substrate portions of the periphery 205 from any of the p-doped tap cells 201, 220, and 240 of memory 200.

Figure 6:
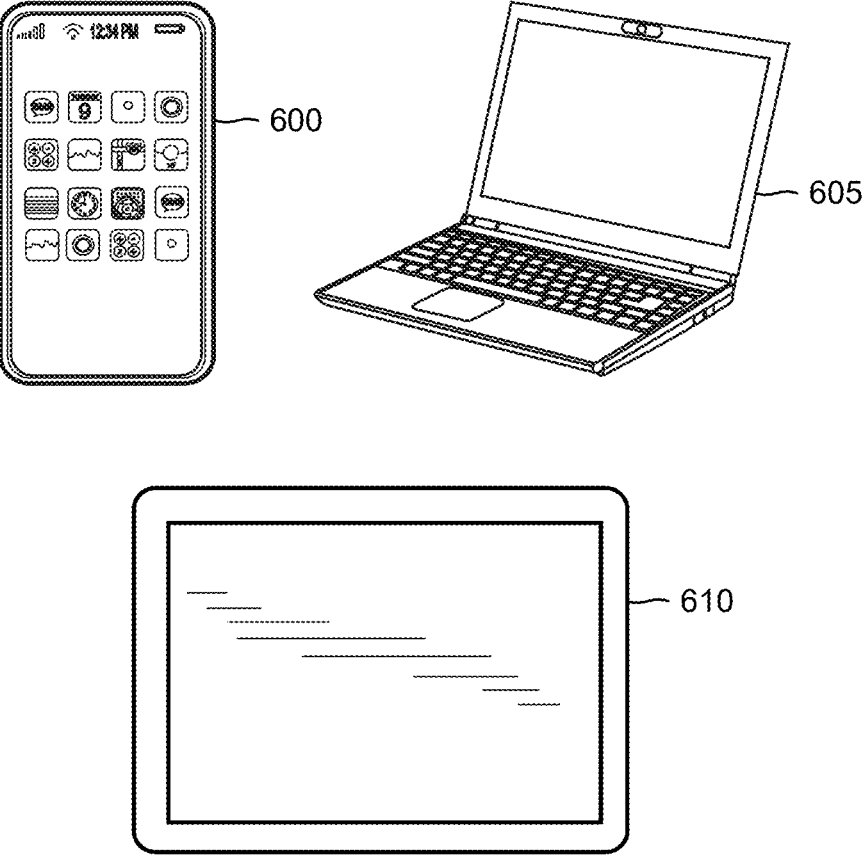
FIG. 6 illustrates some example electronic systems including a memory having a periphery biased in accordance with an aspect of the disclosure.

A memory with the periphery biased by tap cells as disclosed herein may be incorporated in a wide variety of electronic systems. For example, as shown in FIG. 6, a cellular telephone 600, a laptop computer 605, and a tablet PC 610 may all include a memory having a periphery biased in accordance with the disclosure. Other exemplary electronic systems such as an earbud, a music player, a video player, a communication device, and a personal computer may also be configured with a memory constructed in accordance with the disclosure.

The disclosure will now be summarized through the following example clauses:

Clause 1. A memory integrated onto a substrate doped according to a first conductivity type, the memory comprising:
   a first bank of bitcells;
   a periphery for the first bank of bitcells;
   a first bitcell-to-periphery interface having a first boundary shared with the first bank of bitcells and having a second boundary shared with the periphery, wherein the substrate includes a first well doped according to a second conductivity type that extends across the periphery; and
   a first tap cell doped according to the second conductivity type for biasing the first well, the first tap cell being located in a portion of the first well within the first bitcell-to-periphery interface.

Clause 2. The memory of clause 1, wherein the first conductivity type is p-type and the second conductivity type is n-type, the first well being a first n-well and the first tap cell being a first n-doped tap cell.

Clause 3. The memory of clause 2, wherein the first n-well has a height of two standard cells, and wherein the first n-doped tap cell has a height of a single standard cell.

Clause 4. The memory of any of clauses 2-3, further comprising:
   a second n-well extending into the periphery, wherein the second n-well has a height of two standard cells and is spaced apart from the first n-well by a first substrate region of the periphery having a height of two standard cells; and
   a second n-doped tap cell for biasing the second n-well, the second n-doped tap cell being located in a portion of the first bitcell-to-periphery interface containing the second n-well.

Clause 5. The memory of clause 4, wherein the second n-well extends across the periphery.

Clause 6. The memory of clause 4, wherein the second n-well extends from the first bitcell-to-periphery interface to an n-well-to-n-well gap in the periphery, the memory further comprising:
   a second bank of bitcells;

a second bitcell-to-periphery interface, the second bit-cell-to-periphery interface being positioned between the periphery and the second bank of bitcells;

a third n-well that extends from the n-well-to-n-well gap across the periphery towards the second bitcell-to-periphery interface; and a third n-doped tap cell for biasing the third n-well, the third n-doped tap cell being located in a portion of the second bitcell-to-periphery interface containing the third n-well.

Clause 7. The memory of clause 6, wherein the third n-well has a height of two standard cells and the third n-doped tap cell has a height of a single standard cell.

Clause 8. The memory of clause 5, further comprising:

a second bank of bitcells;

a second bitcell-to-periphery interface, the second bit-cell-to-periphery interface being positioned between the periphery and the second bank of bitcells; and a plurality of p-doped tap cells for biasing p-doped substrate portions of the periphery, wherein the plurality of p-doped tap cells is arranged in a column across the second bitcell-to-periphery interface.

Clause 9. The memory of clause 8, wherein the first bitcell-to-periphery interface includes a column of n-doped tap cells.

Clause 10. The memory of clause 4, further comprising:

a first p-doped tap cell for biasing the first substrate region of the periphery, the first p-doped tap cell positioned in a portion of the first bitcell-to-periphery interface between the first n-well and the second n-well.

Clause 11. The memory of clause 10, wherein the first p-doped tap cell is separated from the first n-doped tap cell by a height of one standard cell and is separated from the second n-doped tap cell by a height of one standard cell, and wherein the memory is included within a cellular telephone.

Clause 12. A method of biasing a periphery of a memory, comprising:

biasing a first n-well portion of the periphery from a first n-doped tap cell in a first interface between the periphery and a first bank of bitcells; and biasing a first p-doped substrate portion of the periphery from a first p-doped tap cell in the first interface.

Clause 13. The method of clause 12, further comprising:

biasing a second n-well portion of the periphery from a second n-doped tap cell in the first interface, wherein the first p-doped substrate portion of the periphery separates the first n-well portion from the second n-well portion.

Clause 14. A memory, comprising:

a first bank of bitcells;

a second bank of bitcells;

a periphery for the first bank of bitcells and for the second bank of bitcells;

a first interface between the first bank of bitcells and the periphery;

a second interface between the second bank of bitcells and the periphery; and a plurality of n-doped tap cells for biasing n-well portion of the periphery, the plurality of n-doped tap cells being located within at least one of the first interface and the second interface.

Clause 15. The memory of clause 14, wherein each n-doped tap cell in the plurality of n-doped tap cells is located only within the first interface.

Clause 16. The memory of clause 14, wherein the plurality of n-doped tap cells is distributed across both the first interface and the second interface.

Clause 17. The memory of clause 15, further comprising:

a plurality of p-doped tap cells for biasing p-doped substrate portions of the periphery, wherein each p-doped tap cell in the plurality of p-doped tap cells is located only within the second interface.

Clause 18. The memory of clause 16, further comprising:

a plurality of p-doped tap cells for biasing p-doped substrate portions of the periphery, wherein the plurality of p-doped tap cells is distributed across both the first interface and the second interface.

Clause 19. The memory of clause 18, wherein the p-doped tap cells in the first interface alternate with the n-doped tap cells in the first interface.

Clause 20. The memory of clause 19, wherein adjacent ones of the p-doped tap cells and the n-doped tap cells in the first interface are spaced apart by a single standard cell height.

As those of some skill in this art will by now appreciate and depending on the particular application at hand, many modifications, substitutions and variations can be made in and to the materials, apparatus, configurations and methods of use of the devices of the present disclosure without departing from the scope thereof as defined by the appended claims. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A memory integrated onto a substrate, the substrate being doped according to a first conductivity type, the memory comprising:

a first bank of bitcells;

a periphery for the first bank of bitcells;

a first bitcell-to-periphery interface having a first boundary shared with the first bank of bitcells and having a second boundary shared with the periphery, wherein the substrate includes a first well doped according to a second conductivity type that extends across the periphery; and a first tap cell doped according to the second conductivity type for biasing the first well, the first tap cell being located in a portion of the first well within the first bitcell-to-periphery interface, wherein the first conductivity type is p-type and the second conductivity type is n-type, the first well being a first n-well and the first tap cell being a first n-doped tap cell, wherein the first n-well has a height of two standard cells, and wherein the first n-doped tap cell has a height of a single standard cell.

2. The memory of claim 1, further comprising:

a second n-well extending into the periphery, wherein the second n-well has a height of two standard cells and is spaced apart from the first n-well by a first substrate region of the periphery having a height of two standard cells; and a second n-doped tap cell for biasing the second n-well, the second n-doped tap cell being located in a portion of the first bitcell-to-periphery interface containing the second n-well.

3. The memory of claim 2, wherein the second n-well extends across the periphery.

4. The memory of claim 2, wherein the second n-well extends from the first bitcell-to-periphery interface to an n-well-to-n-well gap in the periphery, the memory further comprising:

a second bank of bitcells;

a second bitcell-to-periphery interface, the second bitcell-to-periphery interface being positioned between the periphery and the second bank of bitcells;

a third n-well that extends from the n-well-to-n-well gap across the periphery towards the second bitcell-to-periphery interface; and a third n-doped tap cell for biasing the third n-well, the third n-doped tap cell being located in a portion of the second bitcell-to-periphery interface containing the third n-well.

5. The memory of claim 4, wherein the third n-well has a height of two standard cells and the third n-doped tap cell has a height of a single standard cell.

6. The memory of claim 3, further comprising:

a second bank of bitcells;

a second bitcell-to-periphery interface, the second bitcell-to-periphery interface being positioned between the periphery and the second bank of bitcells; and a plurality of p-doped tap cells for biasing p-doped substrate portions of the periphery, wherein the plurality of p-doped tap cells is arranged in a column across the second bitcell-to-periphery interface.

7. The memory of claim 6, wherein the first bitcell-to-periphery interface includes a column of n-doped tap cells.

8. The memory of claim 2, further comprising:

a first p-doped tap cell for biasing the first substrate region of the periphery, the first p-doped tap cell positioned in a portion of the first bitcell-to-periphery interface between the first n-well and the second n-well.

9. The memory of claim 8, wherein the first p-doped tap cell is separated from the first n-doped tap cell by a height of one standard cell and is separated from the second n-doped tap cell by a height of one standard cell, and wherein the memory is included within a cellular telephone.

10. A method of biasing a periphery of a memory, comprising:

biasing a first n-well portion of the periphery from a first n-doped tap cell in a first interface between the periphery and a first bank of bitcells;

biasing a first p-doped substrate portion of the periphery from a first p-doped tap cell in the first interface; and biasing a second n-well portion of the periphery from a second n-doped tap cell in the first interface, wherein the first p-doped substrate portion of the periphery separates the first n-well portion from the second n-well portion.

11. A memory, comprising:

a first bank of bitcells;

a second bank of bitcells;

a periphery for the first bank of bitcells and for the second bank of bitcells;

a first interface between the first bank of bitcells and the periphery;

a second interface between the second bank of bitcells and the periphery; and a plurality of n-doped tap cells for biasing n-well portion of the periphery, the plurality of n-doped tap cells being located within at least one of the first interface and the second interface.

12. The memory of claim 11, wherein each n-doped tap cell in the plurality of n-doped tap cells is located only within the first interface.

13. The memory of claim 11, wherein the plurality of n-doped tap cells is distributed across both the first interface and the second interface.

14. The memory of claim 12, further comprising:

a plurality of p-doped tap cells for biasing p-doped substrate portions of the periphery, wherein each p-doped tap cell in the plurality of p-doped tap cells is located only within the second interface.

15. The memory of claim 13, further comprising:

a plurality of p-doped tap cells for biasing p-doped substrate portions of the periphery, wherein the plurality of p-doped tap cells is distributed across both the first interface and the second interface.

16. The memory of claim 15, wherein the p-doped tap cells in the first interface alternate with the n-doped tap cells in the first interface.

17. The memory of claim 16, wherein adjacent ones of the p-doped tap cells and the n-doped tap cells in the first interface are spaced apart by a single standard cell height.

* * * * *